United States Patent
Lin

(10) Patent No.: US 11,830,557 B2
(45) Date of Patent: Nov. 28, 2023

(54) MEMORY APPARATUS

(71) Applicant: Winbond Electronics Corp., Taichung (TW)

(72) Inventor: Zhe-Yi Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 242 days.

(21) Appl. No.: 17/462,013

(22) Filed: Aug. 31, 2021

(65) Prior Publication Data

US 2022/0101929 A1  Mar. 31, 2022

(30) Foreign Application Priority Data

Sep. 25, 2020 (TW) ................................. 109133283

(51) Int. Cl.
*G11C 16/30* (2006.01)
*H02M 3/07* (2006.01)
*G11C 16/04* (2006.01)

(52) U.S. Cl.
CPC .............. *G11C 16/30* (2013.01); *G11C 16/04* (2013.01); *H02M 3/07* (2013.01)

(58) Field of Classification Search
CPC ......... G11C 16/30; G11C 16/04; G11C 5/145; G11C 16/26; G11C 16/32; H02M 3/07; H02M 1/0032; Y02B 70/10
USPC ........................................ 365/185.21, 185.24
See application file for complete search history.

(56) References Cited

U.S. PATENT DOCUMENTS

| | | | |
|---|---|---|---|
| 9,628,061 B2 | 4/2017 | Lu et al. | |
| 2006/0120174 A1* | 6/2006 | Chou | G11C 16/24 365/189.06 |
| 2009/0097308 A1* | 4/2009 | Rao | G11C 11/565 365/174 |
| 2009/0168487 A1* | 7/2009 | Rodriguez | G11C 11/22 365/145 |
| 2010/0321987 A1* | 12/2010 | Lung | G11C 13/0069 365/207 |

(Continued)

FOREIGN PATENT DOCUMENTS

| | | | |
|---|---|---|---|
| EP | 1058268 A2 * | 12/2000 | ............. G11C 11/22 |
| TW | I306609 | 2/2009 | |

(Continued)

OTHER PUBLICATIONS

Kim, Young Bae, A Novel CNFET SRAM-Based Computing-In-Memory Design and Low Power Techniques for AI Accelerator, 2023, Illinois Institute of Technology, All pages. (Year: 2023).*

(Continued)

*Primary Examiner* — Michael T Tran
(74) *Attorney, Agent, or Firm* — JCIPRNET

(57) ABSTRACT

The invention provides a memory apparatus including a memory cell array and a voltage generation circuit. The voltage generation circuit is electrically connected to the memory cell array and includes an active voltage circuit and a sensing circuit. The active voltage circuit is configured to output an operating voltage to the memory cell array when the memory apparatus is in an active mode. The sensing circuit is configured to sense the operating voltage when the memory apparatus is in a standby mode and briefly activate the active voltage circuit to pull up the operating voltage after the operating voltage drops below a threshold.

15 Claims, 2 Drawing Sheets

(56) References Cited

U.S. PATENT DOCUMENTS

| | | | |
|---|---|---|---|
| 2012/0144981 A1* | 6/2012 | Ciccone | G01D 5/2417 |
| | | | 84/746 |
| 2014/0362655 A1* | 12/2014 | Umeda | G11C 11/417 |
| | | | 327/333 |
| 2020/0013467 A1 | 1/2020 | Yamada | |
| 2020/0210801 A1* | 7/2020 | Oda | G06K 19/07788 |
| 2021/0050048 A1* | 2/2021 | Ito | G11C 11/4074 |
| 2021/0247789 A1* | 8/2021 | Chang | G11C 5/147 |
| 2021/0327512 A1* | 10/2021 | Xing | G11C 16/26 |
| 2021/0398594 A1* | 12/2021 | Shimomura | G11C 16/08 |

FOREIGN PATENT DOCUMENTS

| | | | |
|---|---|---|---|
| TW | I672704 | 9/2019 | |
| WO | WO-2021211164 A1 * | 10/2021 | G11C 16/0425 |

OTHER PUBLICATIONS

"Office Action of Taiwan Counterpart Application", dated Apr. 26, 2021, p. 1-p. 4.

* cited by examiner

MEMORY APPARATUS

CROSS-REFERENCE TO RELATED APPLICATION

This application claims the priority benefit of Taiwan application no. 109133283, filed on Sep. 25, 2020. The entirety of the above-mentioned patent application is hereby incorporated by reference herein and made a part of this specification.

TECHNICAL FIELD

The invention relates to an electronic circuit, and particularly relates to a memory apparatus.

BACKGROUND

In order to improve the energy efficiency of the electronic apparatus, in addition to an active mode for the electronic device to access data, the flash memory also has a standby mode with low-power consumption.

However, to allow the flash memory to quickly switch from the standby mode to the active mode, a voltage generation circuit still needs to work to provide a high voltage to the word line coupled to the memory array in the standby mode.

In order to save power, a flash memory circuit is usually configured with two voltage generation circuits for the active mode and the standby mode, and the voltage generation circuit for the standby mode has lower power consumption. In this way, although the power consumption of the flash memory can be reduced, the additional voltage generation circuit increase both the circuit area of the memory to and the electronic elements to be used.

SUMMARY

The invention provides a memory apparatus, which has the advantages of reduced circuit area, simplified circuit elements, and reduced standby current.

An embodiment of the invention provides a memory apparatus, which includes a memory array and a voltage generation circuit. The voltage generation circuit is electrically connected to the memory cell array and includes an active voltage circuit and a sensing circuit. The active voltage circuit is configured to output an operating voltage to the memory cell array when the memory apparatus is in an active mode. The sensing circuit is configured to sense the operating voltage when the memory apparatus is in a standby mode and briefly activate the active voltage circuit to pull up the operating voltage after the operating voltage drops below a threshold.

DETAILED DESCRIPTION

Figure 1:
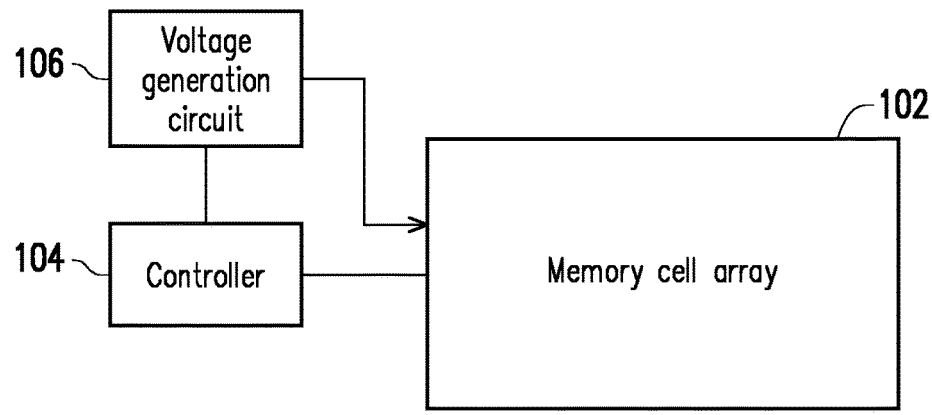
FIG. 1 is a schematic diagram illustrating a memory apparatus in an embodiment of the invention.

FIG. 1 is a schematic diagram illustrating a memory apparatus in an embodiment of the invention. Referring to FIG. 1, a memory apparatus 100 may be an NOR flash memory, but the invention is not limited thereto. The memory apparatus 100 at least includes a memory cell array 102, a controller 104, and a voltage generation circuit 106. The controller 104 is electrically connected to the memory cell array 102 and the voltage generation circuit 106. The controller 104 can control the memory cell array 102 to execute an active mode or a standby mode. The voltage generation circuit 106 correspondingly provides an operating voltage to a word line of the memory cell array 102 according to the active mode or the standby mode. The memory apparatus 100 may also include a word line decoding circuit, a bit line decoding circuit, a driving circuit, and a sense amplifying circuit, which are not shown in FIG. 1. Those with ordinary knowledge in the art should be able to understand the configuration relationship between the above-mentioned elements and the embodiments.

Figure 2:
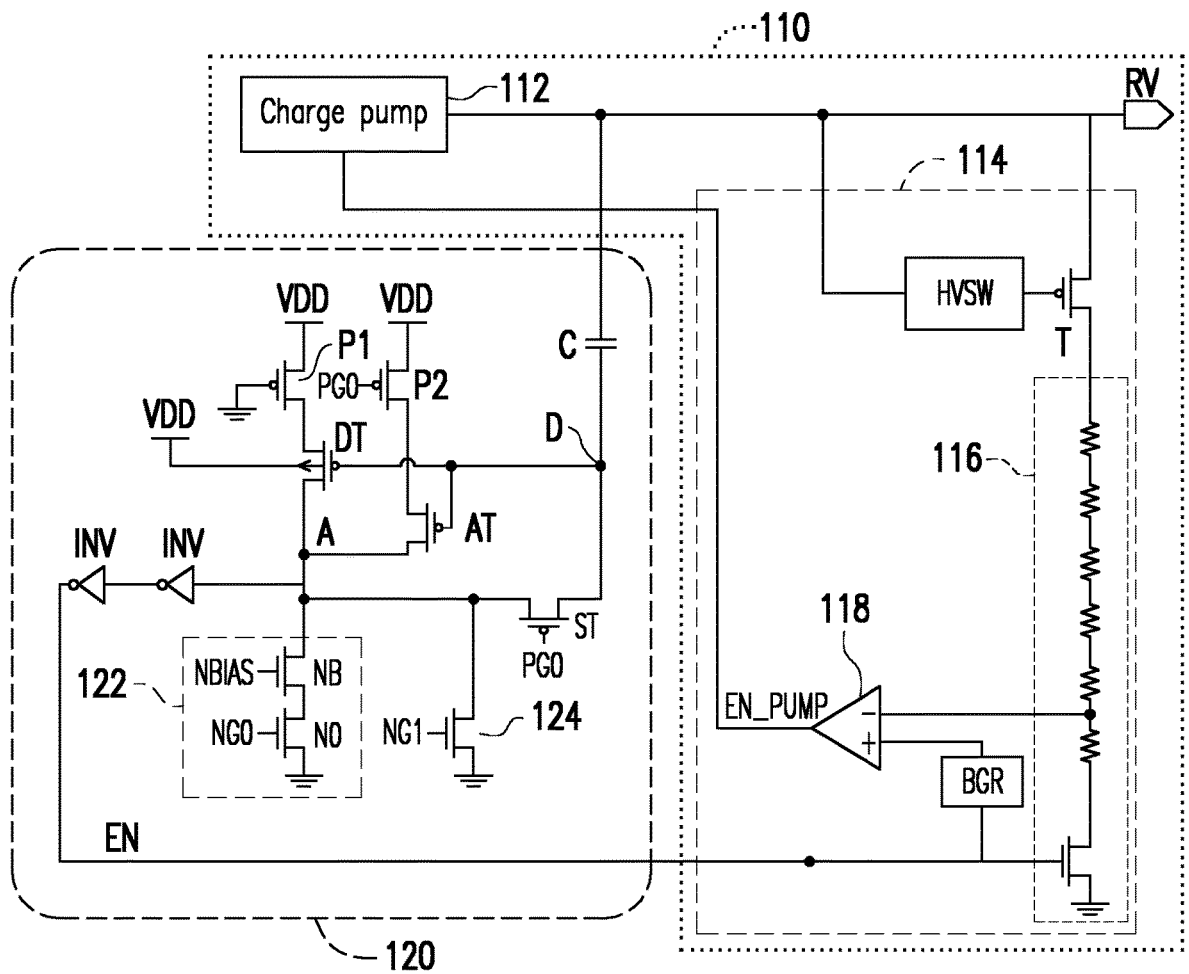
FIG. 2 is a schematic circuit diagram illustrating a voltage generation circuit according to an embodiment of the invention.

FIG. 2 is a schematic circuit diagram illustrating a voltage generation circuit according to an embodiment of the invention. Referring to FIG. 2, a circuit structure of FIG. 2 can be used to illustrate the voltage generation circuit 106. The voltage generation circuit 106 includes an active voltage circuit 110 and a sensing circuit 120. The active voltage circuit 110 is configured to output an operating voltage RV to the memory cell array 102 when the memory apparatus 100 is in the active mode. Here, the operating voltage RV is a reading voltage, for example. When the memory apparatus 100 is in the standby mode, the active voltage circuit 110 also outputs the operating voltage RV, but the difference is that the active voltage circuit 110 continues to be in an enable state in the active mode to stably output the operating voltage RV. However, because the active voltage circuit 110 is only in the enable state intermittently in the standby mode, power can be saved. In the standby mode, the sensing circuit 120 senses the operating voltage RV and briefly activates the active voltage circuit 110 to pull up the operating voltage RV after the operating voltage RV drops below a threshold.

The active voltage circuit 110 includes a charge pump 112 and a voltage regulation circuit (voltage regulator) 114. The charge pump 112 is electrically connected to the voltage regulation circuit 114. The charge pump 112 outputs the operating voltage RV, and the voltage regulation circuit 114 is configured to maintain a voltage value of the operating voltage RV.

The voltage regulation circuit 114 in FIG. 2 includes a high voltage switch HVSW, a transistor T, a voltage division circuit 116 including a plurality of resistors and at least one transistor, a band gap reference circuit BGR, and a voltage comparison amplifier 118. The high voltage switch HVSW is coupled between output terminal of the active voltage circuit 110 and a control terminal of the transistor T. The transistor T and the voltage division circuit 116 are connected to the output terminal of the active voltage circuit 110 and the ground. The voltage comparison amplifier 118 receives an output signal of the band gap reference circuit BGR and a voltage division voltage of the voltage division circuit 116 to output a boosting enable signal EN_PUMP. The charge pump 112 boosts the operating voltage RV according to the boosting enable signal EN_PUMP.

It should be noted that the circuit structure of the voltage regulation circuit 114 in FIG. 2 is only an example, and the invention does not limit the implementation of the voltage regulation circuit 114.

The sensing circuit 120 includes a capacitor C, a sensing transistor DT, an activation transistor AT, and a switching transistor ST. The capacitor C has one terminal coupled to an output terminal of the active voltage circuit 110 to receive the operating voltage RV and another terminal coupled to a sensing node D. The sensing transistor DT has one terminal configured to receive a reference voltage VDD through a transistor P1, another terminal coupled to a reacting node A, and a control terminal coupled to the sensing node D. In other words, the capacitor C has a voltage of one terminal being the operating voltage RV and the other terminal coupled to the control terminal of the sensing transistor DT. Therefore, during a sensing period, a voltage of the sensing node D changes with the operating voltage RV, and the sensing transistor is turned on when the operating voltage RV is lower than a threshold.

The activation transistor AT has one terminal configured to receive the reference voltage VDD through a transistor P2, another terminal coupled to the reacting node A, and a control terminal coupled to the sensing node D. The switching transistor ST has one terminal coupled to the sensing node D, another terminal coupled to the reacting node A, and a control terminal receiving a control signal PG0 together with the transistor P2. In this embodiment, the sensing transistor DT, the activation transistor AT, the switching transistor ST, the transistor P1 and the transistor P2 are all PMOS transistors, but not limited thereto.

After the sensing period ends, the sensing circuit 120 enters an activation period. During the activation period, the switching transistor ST is turned on to correspondingly turn on the activation transistor AT and cut off the sensing transistor DT, and the active voltage circuit 110 is turned on to pull the operating voltage RV back to a target voltage value.

The sensing circuit 120 further includes a discharging switch 122 and a pull-down circuit 124. The discharging switch 122 has one terminal coupled to the reacting node A and another terminal grounded. The discharging switch 122 is turned on during the activation period to output a leakage current and is cut off during the sensing period. The pull-down circuit 124 has one terminal coupled to the reacting node A and another terminal grounded. The pull-down circuit 124 is cut off during the activation period and is turned on during the sensing period to pull down a voltage of the reacting node A.

Specifically, in this embodiment, the discharging switch 122 includes a transistor NB and a transistor N0. The transistor NB and the transistor N0 are connected in series between the reacting node A and the ground. Control terminals of the transistor NB and the transistor N0 receive a control signal NBIAS and a control signal NG0. Those skilled in the art can determine the magnitude of the leakage current by appropriately selecting the transistor NB. The pull-down circuit 124 of this embodiment is implemented by a single transistor. A control terminal of the pull-down circuit 124 receives a control terminal NG1. The transistor NB, the transistor N0, and the pull-down circuit 124 are all NMOS transistors here, but not limited thereto.

Figure 3:
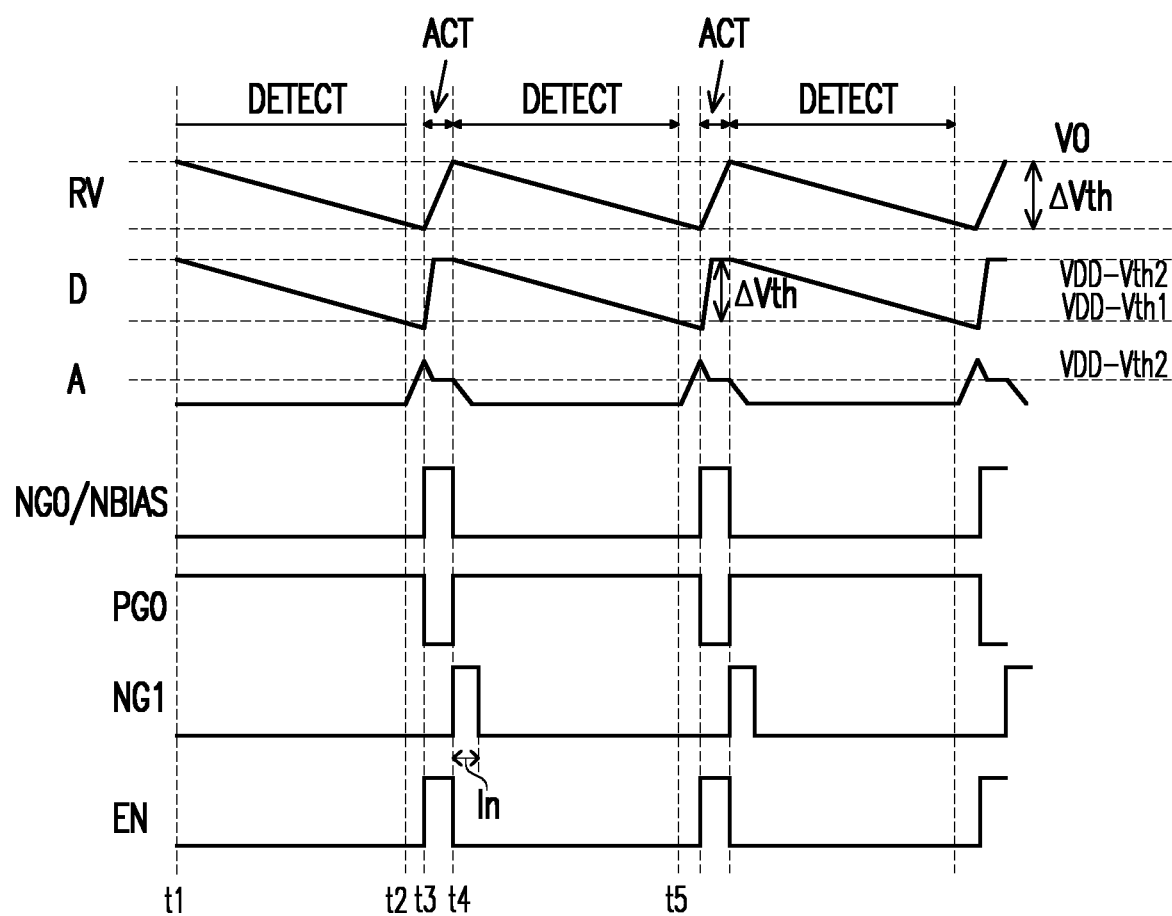
FIG. 3 is a signal waveform diagram of the voltage generation circuit according to an embodiment of the invention.

FIG. 3 is a signal waveform diagram of the voltage generation circuit according to an embodiment of the invention. The signal waveform diagram of FIG. 3 is applicable to the embodiments of FIGS. 1 and 2, and the implementation manner will be described below with reference to FIG. 3 in conjunction with FIG. 2.

A sensing period DECT is between a time point t1 and a time point t2. At the time point t1, the operating voltage RV has been boosted by the charge pump 112 to a target voltage value V0. During the sensing period DECT, because the active voltage circuit 110 is not activated (e.g., in a disable state), the operating voltage RV starts to drop gradually. The sensing circuit 120 monitors the change of the operating voltage RV.

In addition, during the sensing period DECT, the switching transistor ST, the activation transistor AT, the transistor P2, the discharging switch 122, and the pull-down circuit 124 are in a cut off state. Because the capacitor C couples the operating voltage RV to the sensing node D, a voltage of the sensing node D changes with the operating voltage RV. At a beginning (the time pint t1), the sensing transistor DT is in the cut off state. An absolute value of a threshold voltage of the sensing transistor DT is represented by Vth1. At the time point t2, because the voltage of the sensing node D drops below VDD-Vth1, the sensing transistor DT is turned on (which also means that the operating voltage RV is lower than a threshold at this moment).

Between the time point t2 and a time point t3, through the sensing transistor DT and the transistor P1, a voltage of the reacting node A is pulled up by the reference voltage VDD. AT this time, the switching transistor ST, the activation transistor AT, the transistor P2, the discharging switch 122, and the pull-down circuit 124 are still maintained in the cut off state.

An activation period ACT is between the time point t3 and a time point t4. During the activation period ACT, in correspondence to the rise of the voltage of the reacting node A, the control signal PG0, the control signal NBIAS, and the control signal NG0 are all switched to the enable state, and the switching transistor ST, the transistor P2 and the discharging switch 122 are turned on. The pull-down circuit 124 is still in the cut off state. Since the switching transistor ST is turned on, the reacting node A and the sensing node D have a common potential, and the activation transistor AT and the sensing transistor DT are connected in the form of a diode connection. An absolute value of a threshold voltage of the activation transistor AT is represented by Vth2. It should be noted in that, because the absolute value Vth1 of the threshold voltage Vth2 of the sensing transistor DT is greater than the absolute value of the threshold voltage of the activation transistor AT in this embodiment, the activation transistor AT is turned on and the sensing transistor DT is not turned on. The voltages of the reacting node A and the sensing node D are maintained at an activation voltage VDD-Vth2 by the activation transistor AT. At the same time, the discharging switch 122 allows the reacting node A to output a leakage current to the ground.

During the activation period ACT, the reacting node A outputs an enable signal EN through an inverter INV. The enable signal EN is used to activate the active voltage circuit 110, such as the charge pump 112 and the voltage regulation circuit 116, the voltage comparison amplifier 118, and the band gap reference circuit BGR in the voltage regulation circuit 114. The voltage regulating circuit 114 is activated to exert a voltage stabilizing effect. The voltage comparison amplifier 118 outputs the boosting enable signal EN_PUMP so that the charge pump 112 pulls the operating voltage RV back to the target voltage value V0. In other words, through the activation transistor AT, the voltages of the reacting node A and the sensing node D are changed to the activation voltage VDD-Vth2 to activate the active voltage circuit 110.

In short, the operating voltage RV starts to decay from the target voltage value V0. When the operating voltage RV is lower than the threshold, the active voltage circuit 110 increases the operating voltage RV back to the target voltage value V0 again. A ripple size of the operating voltage RV is determined by a difference $\Delta Vth$ between the threshold voltages of the sensing transistor DT and the activation transistor AT. Here, ΔVth=Vth1−Vth2. The threshold described above is V0-ΔVth.

It is the sensing period DECT again between the time point t4 and a time point t5. At the beginning (the time point t4) of the sensing period DECT, the discharging switch 122 is cut off and the pull-down circuit 124 is turned on during the initial period In. FIG. 3 uses an initial period In to indicate an enable period of the control signal NG1. The initial period In is shorter than the sensing period DECT. The discharging switch 122 pulls down the voltage of the reacting node A to the ground during the initial period In to initialize the voltage of the reacting node A. After the initial period In, the discharging switch 122 is cut off again.

When the operating voltage RV rises to substantially equal to the target voltage value V0 (at the time point t4), the control signal PG0, the control signal NBIAS, and the control signal NG0 are switched back to the disable state. Accordingly, the discharging switch 122 is cut off, and the switching transistor ST, the transistor P2 and the discharging switch 122 are also switched to the cut off state. Then, the operations in the sensing period DECT and the activation period ACT are repeated. Whether to re-enter the activation period ACT to activate the active voltage circuit 110 is determined by whether the sensing transistor DT is turned on.

In particular, the activation period ACT is shorter than the sensing period DECT. In addition, a turned on time of the sensing transistor DT is also very short, which is also shorter than the sensing period DECT.

In the standby mode, the sensing circuit 120 only briefly activates the active voltage circuit 110. Since the active voltage circuit 110 still does not activate most of the time, it does not need to consume too much power overall so the power saving requirements can be met. In addition, the sensing circuit 120 does not need to have high power consumption circuit elements such as a voltage comparison amplifier or a charge pump, nor does it need to have a voltage division circuit composed of multiple resistors. Therefore, advantages of reducing standby current and reducing circuit area can be provided.

In summary, the memory apparatus does not need to be configured with a low-power voltage generation circuit for the standby mode. Instead, the sensing circuit can intermittently activate the voltage generation circuit in the active mode to achieve the effect of low power consumption for outputting the operating voltage, so that the original voltage generation circuit can also be applied to the standby mode. As a result, the memory apparatus according to the embodiments of the invention has the advantages of reduced circuit area, simplified circuit elements, and reduced standby current.

The invention claimed is:

1. A memory apparatus, comprising:
a memory cell array; and
a voltage generation circuit electrically connected to the memory cell array and comprising:
an active voltage circuit configured to output an operating voltage to the memory cell array when the memory apparatus is in an active mode; and
a sensing circuit configured to sense the operating voltage when the memory apparatus is in a standby mode and briefly activate the active voltage circuit to pull up the operating voltage after the operating voltage drops below a threshold, wherein the sensing circuit comprises:
a capacitor having one terminal coupled to an output terminal of the active voltage circuit and another terminal coupled to a sensing node; and
a sensing transistor having one terminal configured to receive a reference voltage, another terminal coupled to a reacting node, and a control terminal coupled to the sensing node,
wherein during a sensing period, a voltage of the sensing node changes with the operating voltage, and the sensing transistor is turned on when the operating voltage is lower than a threshold.

2. The memory apparatus of claim 1, wherein the sensing circuit comprises:
an activation transistor having one terminal configured to receive the reference voltage, another terminal coupled to the reacting node, and a control terminal coupled to the sensing node;
a switching transistor having one terminal coupled to receive the sensing node and another terminal coupled to the reacting node,
wherein during an activation period, the switching transistor is turned on to correspondingly turn on the activation transistor and cut off the sensing transistor, and the active voltage circuit is turned on to pull the operating voltage back to a target voltage value.

3. The memory apparatus of claim 2, wherein an absolute value of a threshold voltage of the sensing transistor is greater than an absolute value of a threshold voltage of the activation transistor.

4. The memory apparatus of claim 2, wherein during the activation period, voltages of the reacting node and the sensing node are changed to an activation voltage to activate the active voltage circuit, and during the sensing period, the active voltage circuit is not activated.

5. The memory apparatus of claim 2, wherein the sensing circuit further comprises:
a discharging switch having one terminal coupled to the reacting node and another terminal grounded, wherein the discharging switch is turned on during the activation period to output a leakage current and is cut off during the sensing period; and
a pull-down circuit having one terminal coupled to the reacting node and another terminal grounded, wherein the pull-down circuit is cut off during the activation period and is turned on during the sensing period to pull down a voltage of the reacting node.

6. The memory apparatus of claim 5, wherein at a beginning of the sensing period, the discharging switch is cut off and the pull-down circuit is turned on during an initial period, wherein the initial period is shorter than the sensing period.

7. The memory apparatus of claim 2, wherein the activation period is shorter than the sensing period.

8. The memory apparatus of claim 2, wherein when the memory apparatus is in the standby mode, a ripple size of the operating voltage is determined by a difference between the thresholds of the sensing transistor and the activation transistor.

9. The memory apparatus of claim 8, wherein the threshold is the target voltage value minus the difference.

10. The memory apparatus of claim 1, wherein the active voltage circuit comprises:
a charge pump, configured to output the operating voltage; and
a voltage regulation circuit, electrically connected to the charge pump, configured to maintain a voltage value of the operating voltage.

11. The memory apparatus of claim 10, wherein the voltage regulation circuit comprises:
a first transistor;
a high voltage switch, coupled between an output terminal of the active voltage circuit and a control terminal of the first transistor;
a voltage division circuit, comprising a plurality of resistors and at least one transistor, wherein the first transistor and the voltage division circuit are connected in series between the output terminal of the active voltage circuit and a ground;
a band gap reference circuit; and
a voltage comparison amplifier, receiving an output signal of the band gap reference circuit and a voltage division voltage of the voltage division circuit to output a boosting enable signal,
wherein the charge pump boosts the operating voltage according to the boosting enable signal.

12. The memory apparatus of claim 2, wherein the one terminal of the sensing transistor receives a reference voltage through a second transistor.

13. The memory apparatus of claim 2, wherein the activation transistor having the one terminal configured to receive the reference voltage through a third transistor, another terminal coupled to the reacting node, and the control terminal coupled to the sensing node.

14. The memory apparatus of claim 12, wherein a voltage of the reacting node is pulled up by the reference voltage through the sensing transistor and the second transistor between the sensing period and the activation period.

15. The memory apparatus of claim 2, wherein a turned on time of the sensing transistor is shorter than the sensing period.

* * * * *